United States Patent
Graf

(10) Patent No.: US 11,519,955 B2
(45) Date of Patent: Dec. 6, 2022

(54) METHOD AND CIRCUIT FOR TESTING THE FUNCTIONALITY OF A TRANSISTOR COMPONENT

(71) Applicant: Infineon Technologies AG, Neubiberg (DE)

(72) Inventor: Alfons Graf, Kaufering (DE)

(73) Assignee: Infineon Technologies AG, Neubiberg (DE)

( * ) Notice: Subject to any disclaimer, the term of this patent is extended or adjusted under 35 U.S.C. 154(b) by 108 days.

(21) Appl. No.: 17/174,927

(22) Filed: Feb. 12, 2021

(65) Prior Publication Data

US 2021/0255235 A1     Aug. 19, 2021

(30) Foreign Application Priority Data

Feb. 14, 2020   (DE) .......................... 102020103874.7

(51) Int. Cl.
    *G01R 31/26*     (2020.01)
(52) U.S. Cl.
    CPC ..... *G01R 31/2621* (2013.01); *G01R 31/2608* (2013.01)
(58) Field of Classification Search
    CPC ................ G01R 31/26; G01R 31/2621; G01R 31/2608; G01R 27/2605; G01R 31/2607; G01R 31/2641; G01R 27/08
    See application file for complete search history.

(56) References Cited

U.S. PATENT DOCUMENTS

| | | | |
|---|---|---|---|
| 4,142,150 A * | 2/1979 | Morrow | G01R 31/2608 324/762.08 |
| 9,541,599 B2 * | 1/2017 | Sato | G01R 31/2608 |
| 2006/0221527 A1 | 10/2006 | Jacobson | |
| 2007/0139841 A1 | 6/2007 | Ohshima | |
| 2009/0102504 A1 | 4/2009 | Voigtlaender | |
| 2017/0192049 A1 | 7/2017 | Tavernier et al. | |
| 2017/0299644 A1 | 10/2017 | Kaltenegger et al. | |
| 2017/0336475 A1 | 11/2017 | Wortberg | |
| 2019/0056448 A1 | 2/2019 | Asam | |
| 2019/0101585 A1 | 4/2019 | Marques Martins et al. | |

FOREIGN PATENT DOCUMENTS

| | | |
|---|---|---|
| DE | 102005057577 A1 | 6/2007 |
| DE | 102018119727 A1 | 2/2019 |
| DE | 102018123856 A1 | 4/2019 |
| EP | 3255443 A1 | 12/2017 |
| EP | 3282533 A1 | 2/2018 |

* cited by examiner

*Primary Examiner* — Son T Le
(74) *Attorney, Agent, or Firm* — Slater Matsil, LLP

(57) ABSTRACT

In an embodiment, a method for testing a functional integrity of a transistor component, the method includes causing a first change of a charge state of an internal capacitance between control terminals of the transistor component; determining a capacitance value of the internal capacitance based on the first change of the charge state; causing a second change of the charge state of the internal capacitance; and evaluating a resistance value of an internal resistance between the control terminals based on the determined capacitance value and the second change of the charge state.

23 Claims, 13 Drawing Sheets

METHOD AND CIRCUIT FOR TESTING THE FUNCTIONALITY OF A TRANSISTOR COMPONENT

This application claims the benefit of German Application No. 102020103874.7, filed on Feb. 14, 2020, which application is hereby incorporated herein by reference in its entirety.

TECHNICAL FIELD

This description relates to a method and circuit for testing the functional integrity of a transistor component.

BACKGROUND

Transistor components with insulated gate electrodes, such as metal oxide semiconductor field-effect Transistors (MOSFETs) or insulated gate bipolar transistors (IGBTs), are widely used as electronic switches in a wide range of sectors, such as the automotive, industrial, domestic and consumer electronics sectors. The voltage resistance of such transistor components varies between several 10s of volts (V) and several kilovolts (kV), depending on the application.

Transistor components are tested for their functional integrity at the end of the manufacturing process. However, in some applications, particularly in safety-critical applications such as in motor vehicles, it is necessary to test the functional integrity of the transistor components during operation, in order to be able to take appropriate measures in the event of a faulty transistor component.

There is a need for a method for testing the integrity of a transistor component during operation that does not significantly affect the operation of the transistor component, and for a circuit to implement such a method.

SUMMARY

An example relates to a method for testing the integrity of a transistor component. The method comprises a first change of a charge state of an internal capacitance between control terminals of the transistor component, determining a capacitance value of the internal capacitance based on the first change of the charge state, a second change of the charge state of the internal capacitance and evaluating a resistance value of an internal resistance between the control terminals based on the determined capacitance value and the second change of the charge state.

Another example relates to an electronic circuit which is designed to be connected to control terminals of a transistor component to carry out a first change of a charge state of a capacitance present between control terminals of the transistor component, to determine a capacitance value of the capacitance based on the first change of the charge state, to carry out a second change of the charge state of the capacitance present between the control terminals of the transistor component, and to determine a resistance value of a resistance present between the control terminals based on the measured capacitance value and the second change of the charge state.

BRIEF DESCRIPTION OF THE DRAWINGS

Examples are explained below based on drawings. The drawings are used to illustrate specific principles, so that only aspects necessary for understanding these principles are presented. The drawings are not to scale.

Figure 1:
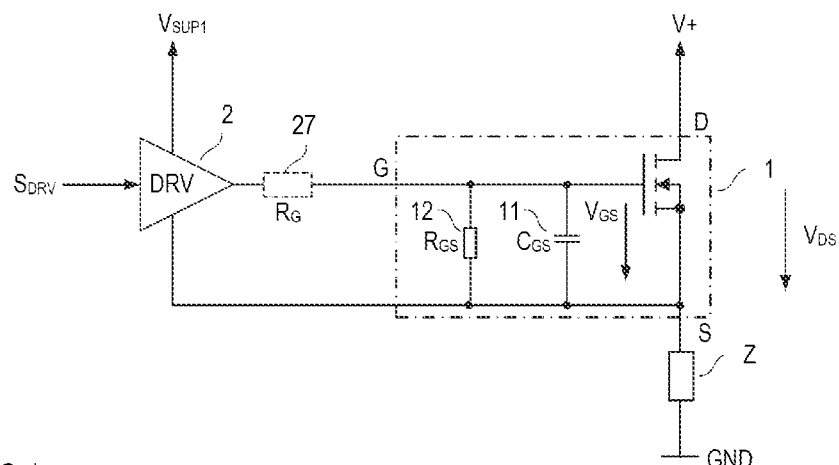
FIG. 1 shows a circuit representing an application example for a transistor component.

In the drawings, the same reference signs refer to the same features. In addition, it goes without saying that the features of the various exemplary embodiments described herein can be combined with one another, unless specifically stated otherwise.

DETAILED DESCRIPTION OF ILLUSTRATIVE EMBODIMENTS

Embodiments relate to a method and circuit for testing the functional integrity of a transistor component, in particular a transistor component with an isolated gate electrode.

FIG. 1 shows an example of a circuit having a transistor component 1, a driver circuit 2 for controlling the transistor component 1, and a load Z, which is connected in series with a load section D-S of the transistor component. The load Z in FIG. 1 represents any electrical load or any electrical circuit that obtains a current $I_{DS}$ via the transistor component 1. A series circuit of the load section of the transistor component 1 and the load Z is connected, for example, between terminals for a positive supply potential and a negative supply potential or ground GND, such that a supply voltage V+, subsequently also referred to as the load supply voltage, is applied across the series circuit.

In the example shown in FIG. 1, the transistor component 1 has the function of a high-side switch, i.e. an electronic switch, the load section of which is connected between the load Z and the node for the positive supply potential. But this is merely one example. The load section of the transistor component 1 and the load Z can also be interconnected in any other configuration. Thus, the transistor component 1 can also have the function of a low-side switch, i.e. a switch that is connected between the load and the negative supply potential or ground GND.

The transistor component 1 is a voltage-controlled transistor component that either conducts or blocks, depending on a control voltage $V_{GS}$ applied between control terminals. For illustration purposes only, the transistor component in FIG. 1 is a MOSFET with a gate terminal G, a drain terminal D and a source terminal S. The load section of this MOSFET runs between the drain terminal D and the source terminal S. In the example shown in FIG. 1, the control terminals of this MOSFET are the gate terminal G and the source terminal S; the control voltage $V_{GS}$ is therefore the voltage applied between the gate terminal G and the source terminal S. However, the fact that the source terminal S is simultaneously one of the load section terminals and one of the control terminals of the transistor component 1 is only one example. The control terminals between which the control voltage is applied could also be separate from the load section terminals. According to another example (not shown), the second control terminal is therefore isolated from the second load section terminal of the transistor component.

In any case, the transistor component 1 conducts or blocks depending on the control voltage $V_{GS}$ between the control terminals G, S, wherein the transistor component 1 conducts, for example, if the control voltage $V_{GS}$ is above a threshold voltage Vth of the transistor component and blocks if the control voltage $V_{GS}$ is below the threshold voltage Vth. This is shown in FIG. 2.

Figure 2:
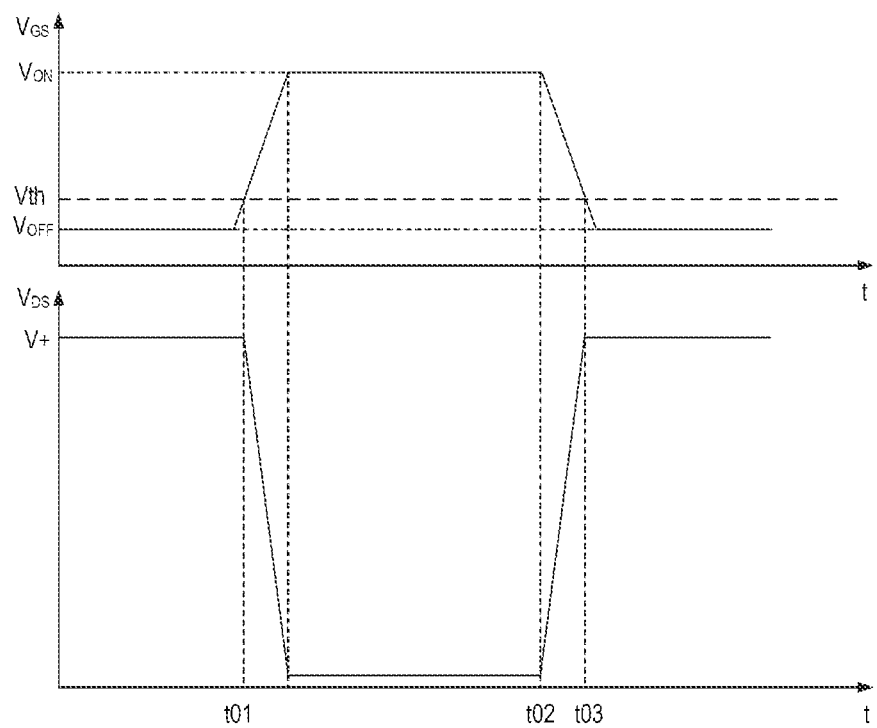
FIG. 2 shows schematic signal waveforms of a control voltage and a load section voltage for a transistor component in the switched-on state and switched-off state.

FIG. 2 shows in schematic form the temporal waveforms of the control voltage $V_{GS}$ and a load section voltage $V_{DS}$, which is the voltage between the first and second load section terminals D, S, over time. In the example shown in FIG. 2, the control voltage $V_{GS}$ has either an off level $V_{OFF}$ below the threshold voltage Vth, or an on level $V_{ON}$ above the threshold voltage Vth. The transistor component 1 is in the off state when the control voltage $V_{GS}$ has the off level $V_{OFF}$. In this case, the transistor component blocks, so that the load section voltage $V_{DS}$ is essentially the same as the load supply voltage V+. The transistor component 1 is in the on state when the control voltage $V_{GS}$ has the on level $V_{ON}$. In this case, the load section voltage $V_{DS}$ is significantly lower than in the off state and is essentially given by the load current $I_{DS}$ flowing through the transistor component 1 multiplied by an on resistance of the transistor component, whereby the on resistance is the electrical resistance of the transistor component in the switched-on state.

In the example shown in FIG. 2, the control voltage $V_{GS}$ exceeds the threshold voltage Vth at a first time t01, with the transistor component transferring to the on state from this time onwards, and the load section voltage $V_{DS}$ decreasing. In the example shown in FIG. 2, from a second time t02 the control voltage $V_{GS}$ begins to decrease, with the control voltage $V_{GS}$ falling below the threshold voltage Vth at a third time t03, with the result that from this time t03 the transistor component blocks.

In the example shown in FIG. 1, the transistor component 1 is controlled by a driver circuit 2, which receives a control signal $S_{DRV}$ and a first supply voltage $V_{SUP1}$. The driver circuit 2 is designed to generate the control voltage $V_{GS}$ from the first supply voltage $V_{SUP1}$ taking account of the control signal $S_{DRV}$. The driver circuit 2 is designed in particular to generate the on level $V_{ON}$ of the control voltage $V_{GS}$ when the control signal $S_{DRV}$ has a signal level indicating that the transistor component 1 should be switched on, and to generate the off level $V_{OFF}$ of the control voltage $V_{GS}$ when the control signal $S_{DRV}$ has a signal level indicating that the transistor component 1 should be switched off. Optionally, a series resistor 27 is connected between an output of the driver circuit 2 and the control input of the transistor component 1 formed by the first and second control terminals G, S.

Figures 3A, 3B:
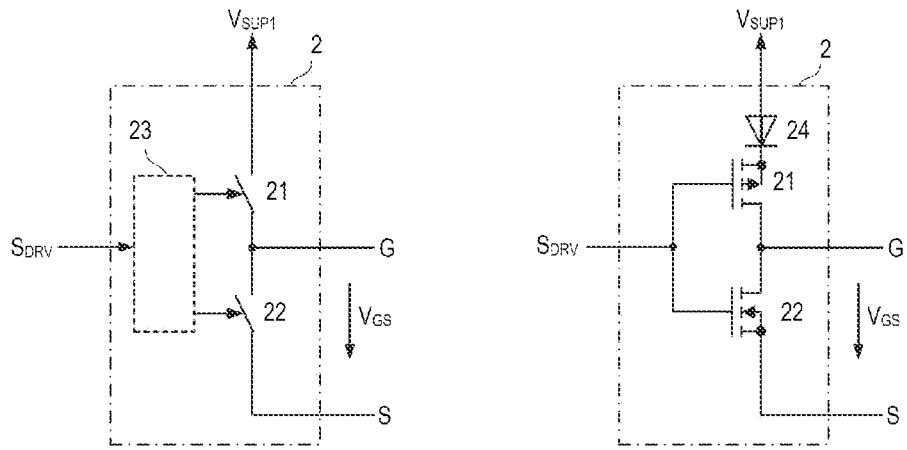
FIGS. 3A and 3B show examples of a driver circuit for controlling a transistor component.

FIG. 3A shows an example of a driver circuit 2, which is designed to generate the control voltage $V_{GS}$ based on the control signal $S_{DRV}$ and the first supply voltage $V_{SUP1}$. This driver circuit 2 comprises a half-bridge with a high-side switch (HS switch) 21 and a low-side switch (LS switch) 22, wherein the load sections of these switches 21, 22 are connected between a supply terminal and the second control terminal (the source terminal S) of the transistor component 1 such that the first supply voltage $V_{SUP1}$ is applied across the half-bridge. An output of the half-bridge, which is formed by a circuit node common to the HS switch 21 and the LS switch 22, is connected to the first control terminal (the gate terminal G) of the transistor component 1. In this driver circuit 2, the control voltage $V_{GS}$ is a voltage across the LS switch 22. The two switches 21, 22 of the half-bridge are controlled according to the control signal $S_{DRV}$ and in a complementary manner to each other, so that at the same time only one of the two switches 21, 22 is conducting. In order to generate the on level $V_{ON}$ of the control voltage $V_{GS}$, for example, the HS switch 21 is driven in conducting mode and the LS switch 22 is driven in blocking mode. Similarly, to generate the off-level $V_{OFF}$, the HS switch 21 is driven in blocking mode and the LS switch 22 is driven in conducting mode, wherein in the example shown in FIG. 3A, the off-level $V_{OFF}$ corresponds to a voltage of zero. The activation of the two switches 21, 22 depending on the control signal $S_{DRV}$ can be carried out by an optional control circuit 23.

The HS switch 21 and the LS switch 22 can be designed as any type of electronic switch, wherein in particular the HS switch can be designed as a bi-directionally blocking electronic switch.

Referring to FIG. 3B, a control circuit 23 as shown in FIG. 3A can be omitted, for example, if the HS switch 21 and the LS switch 22 are implemented as complementary transistors, each receiving the $S_{DRV}$ control signal. For example, the HS switch 21 is a p-conducting MOSFET (p-MOSFET), while the LS switch 22 is an n-conducting MOSFET (n-MOSFET). For example, these two MOSFETs 21, 22 are interconnected such that their drain terminals are connected together and connected to the gate terminal G of the transistor component.

The p-MOSFET 21 and the n-MOSFET 22 according to FIG. 3B can be realized as unidirectionally blocking devices, which in the blocking controlled state are able to block a voltage with only one specific polarity, while at a voltage with an opposite polarity an internal body diode conducts independently of the switching state of the MOSFET (i.e. regardless of whether the MOSFET is conducting or blocking). In the example shown in FIG. 3B, the n-MOSFET 22 is interconnected in such a way that it blocks in the blocking-driven state if the control voltage $V_{GS}$ is positive. The p-MOSFET 21 is interconnected in such a way that it blocks in the blocking state if the control voltage $V_{GS}$ is less than or equal to the first supply voltage $V_{SUP1}$.

Optionally, a diode 24 can be connected in series with the p-MOSFET 21, which is polarized in such a way that it is connected in anti-series with the internal body diode (not shown) of the p-MOSFET 21. As a result, the control voltage $V_{GS}$ can increase above the value of the first supply voltage $V_{SUP}$, which may be necessary to test the integrity of the transistor component 1, as explained in detail below.

Referring to FIG. 1, the transistor component between the control terminals G, S has an internal capacitance 11, which in a MOSFET is usually referred to as the gate-source capacitance and which will subsequently also be referred to as the control capacitance of the transistor component 1. In addition, the transistor component 1 has an internal electrical resistance 12 in parallel with the control capacitance 11, which in the case of a MOSFET is usually referred to as a gate-source resistance and which represents the leakage current behavior of the control capacitance 11. A resistance value $R_{GS}$ of this internal resistance 12 is ideally very high (for example in the range of several Gigaohm (GΩ) or higher). A capacitance value $C_{GS}$ of the control capacitance 11 depends, among other things, on the respective design of the transistor component 1.

In various applications, particularly in safety-critical applications such as in automobiles, it is desirable to test the integrity of the transistor component 1 during operation. The integrity of the transistor component 1 depends essentially on the resistance value $R_{GS}$ of the internal resistance 12 and the capacitance value $C_{GS}$ of the control capacitance 11, wherein a proper functioning of the transistor component 1 is assumed, for example, if the resistance value $R_{GS}$ is above a specified minimum value and if the capacitance value $C_{GS}$ is within a specified capacitance range, i.e. if:

$$R_{GS} > R_{GS\_MIN} \quad (1a),$$

$$C_{GS\_MIN} < C_{GS} < C_{GS\_MAX} \quad (1b)$$

where $R_{GS\_MIN}$ is a minimum value for the resistance value $R_{GS}$ of the internal resistance 12 and $C_{GS\_MIN}$ and $C_{GS\_MAX}$ define a permissible range for the capacitance value $C_{GS}$ of the control capacitance 11. It is desirable to test the resistance value $R_{GS}$ and the capacitance value $C_{GS}$ during operation of the transistor component 1 to verify whether these values are within a permissible range in each case, for example, whether these values meet the conditions defined in (1a) and (1b), in order to be able to verify the integrity of the transistor component 1 on this basis. According to an example, it is assumed that the transistor component 1 is no longer functional if the resistance value $R_{GS}$ is less than the minimum value $R_{GS\_MIN}$ or if the capacitance value $C_{GS}$ is outside the range defined in (1b).

Examples of such a method for testing the integrity of the transistor component are explained below. In these examples, purely for the purpose of explanation, the transistor component 1 is a MOSFET, the control input of which is formed by a gate terminal G and a source terminal S. But this is merely one example. The methods described for testing the integrity of the transistor component 1 by testing the internal capacitance 11 and the internal resistance 12 are not limited to a MOSFET, but can be applied to any other voltage-controlled transistor components with an insulated gate electrode, such as an IGBT, a HEMT (High Electron Mobility Transistor), or similar. The MOSFET shown in the examples below is a self-blocking n-conducting MOSFET. But again, this is merely an example. The method is also suitable for a p-conducting MOSFET and for both self-blocking and self-conducting MOSFETs, where the individual types of MOSFETs (n-conducting or p-conducting, self-blocking or self-conducting) differ only by their respective threshold voltage.

Figure 4:
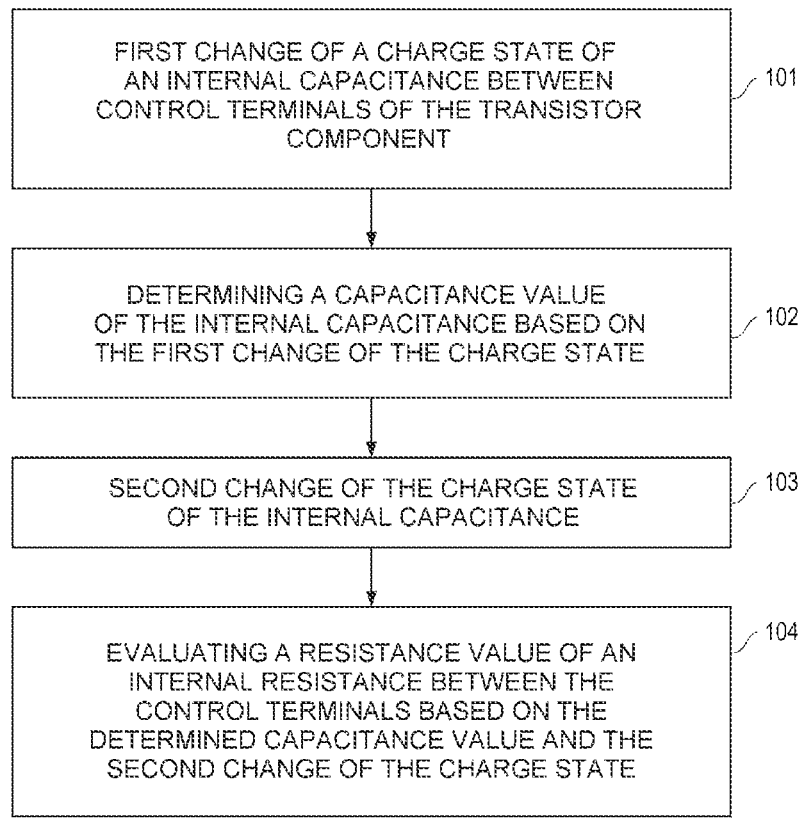
FIG. 4 shows a flow diagram of an example of a method for testing the integrity of a transistor component, wherein the method comprises a first change and a second change of a charge state of an internal capacitance of the transistor component.

An example of a method for testing the functionality of the transistor component 1 is shown in FIG. 4 using a flow diagram. This method comprises a first change of a charge state of an internal capacitance 11 between the control terminals G, S of the transistor component 1 (cf. 101 in FIG. 4), determining a capacitance value $C_{GS}$ of the internal capacitance 11 based on the first change of the charge state (cf. 102 in FIG. 4), a second change of the charge state of the internal capacitance 11 (cf. 103 in FIG. 4), and evaluating the resistance value $R_{GS}$ of the internal resistance 12 between the control terminals G, S based on the determined capacitance value $C_{GS}$ and the second change of the charge state. The first and second change of the charge state of the internal capacitance 11 is associated in each case with a change of the control voltage $V_{GS}$.

According to an example, it is provided to carry out the first change of the charge state in such a way that a difference between the control voltage $V_{GS}$ and the threshold voltage Vth increases during the first change of the charge state. This prevents the first change of the charge state of the internal capacitance 11 from having an undesirable effect on the switching state of the transistor component 1. For example, if the transistor component 1 is implemented as an n-conducting MOSFET and if the functionality of the transistor component 1 in the on state is to be tested, the charge state of the internal capacitance 11 is changed during the first change process such that the control voltage $V_{GS}$ increases further compared to the on level $V_{ON}$. This is shown schematically in FIG. 5. During the second change, the control voltage can then decrease again in the direction of the on level.

For example, if the transistor component 1 is implemented as an n-conducting MOSFET and if the functionality of the transistor component 1 in the off state is to be tested, the charge state of the internal capacitance 11 is changed during the first change process such that the control voltage $V_{GS}$ decreases further compared to the on level $V_{OFF}$. This is shown schematically in FIG. 6. During the second change, the control voltage can then increase again in the direction of the off level.

Figure 5:
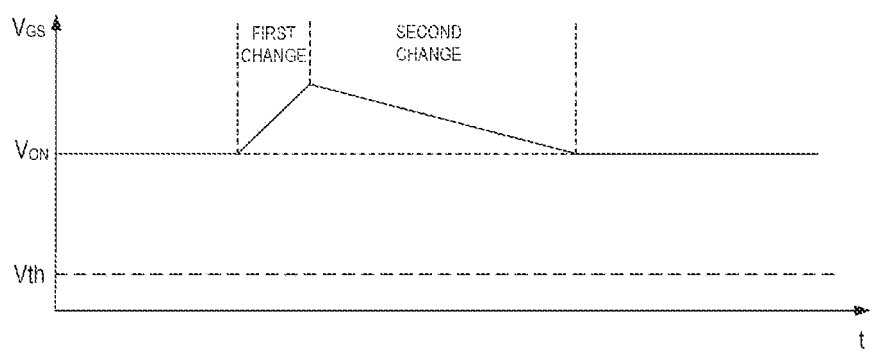
FIGS. 5 and 6 show schematic examples of the first change and the second change of the charge state of the internal capacitance using the signal waveforms of a control voltage of the transistor component.
Figure 6:
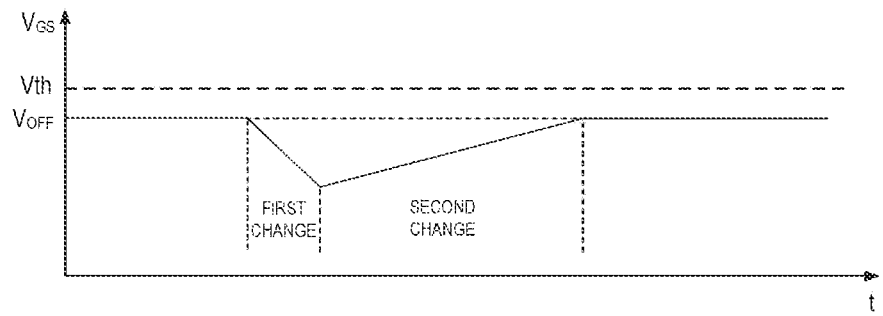

In both the example shown in FIG. 5 and the example shown in FIG. 6, a difference between the control voltage $V_{GS}$ and the threshold voltage Vth increases during the testing phase, in order to prevent the testing of the integrity of the transistor component 1 from affecting its switching state. The "testing phase" comprises at least the described first and second change of the charge state of the internal capacitance 11.

Figure 7:
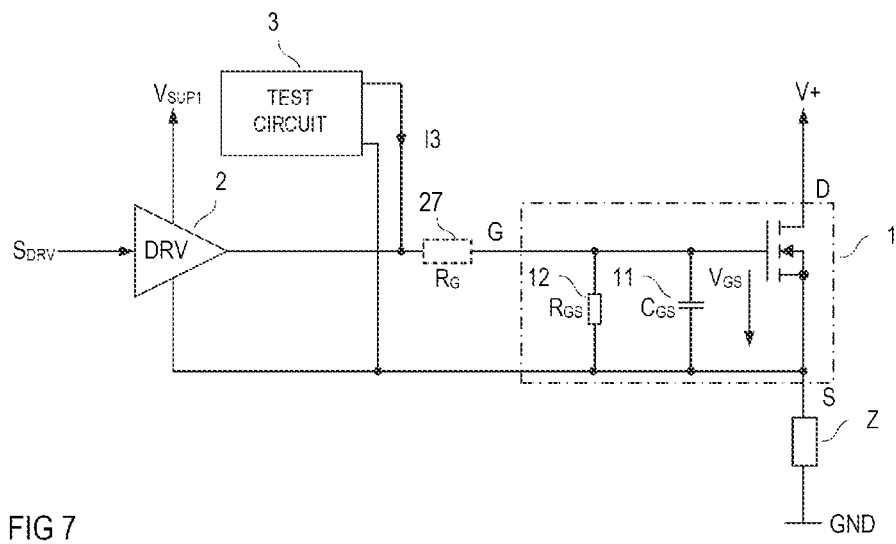
FIG. 7 shows a circuit arrangement with a transistor component and with a circuit for testing the functional integrity of the transistor component.

With reference to FIG. 7, the internal capacitance 11 and internal resistance 12 are tested by means of a test circuit 3, for example, which is connected to the control input G, S of the transistor component 1. Examples of the implementation of this test circuit 3 and its operating principle are explained in detail below.

In each of the examples explained below it is assumed that the integrity of the transistor component 1 is tested when the transistor component 1 is in the on state. In these examples, the control voltage $V_{GS}$ therefore has the on level $V_{ON}$ and the control voltage $V_{GS}$ increases further during the first change of the charge state of the internal capacitance 11. But this is merely one example. The examples explained below can also be modified in a simple way such that the integrity of the transistor component 1 is tested in the off state and the control voltage $V_{GS}$ decreases further during the first change of the charge state of the internal capacitance 11.

Figure 8:
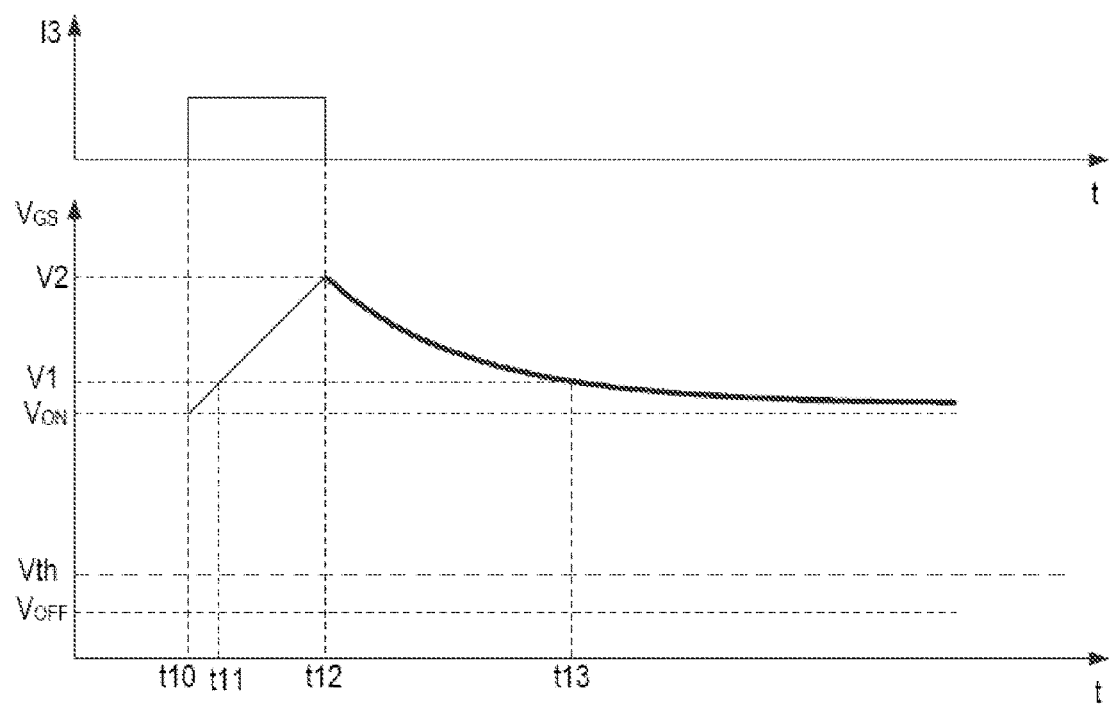
FIG. 8 shows signal waveforms illustrating a first example of a method for testing the functional integrity of the transistor component.

FIG. 8 illustrates an example of a method for testing the internal capacitance 11 and the internal resistance 12. The first change in the charge state of the internal capacitance 11 in this method comprises charging the internal capacitance 11 with a constant charging current I3, so that the control voltage $V_{GS}$ increases at least approximately linearly starting from the on level $V_{ON}$. To determine the capacitance value $C_{GS}$ in this method, the time required for a specific change in the control voltage $V_{GS}$ with a charging current I3 flowing is measured. More precisely, this method determines how long it takes for the control voltage $V_{GS}$ to rise from a first voltage level V1 to a higher second voltage level V2. The first voltage level V1 is above the on level and in the example shown in FIG. 8 is reached at a first time t11. This first time t11 is after the start time t01 of the testing process, wherein from the start time t01 the capacitance 11 is charged starting from the on level $V_{ON}$.

As shown in FIG. 8, the control voltage $V_{GS}$ reaches the second voltage level V2 at a second time t12. Based on a time difference Δt1=t12−t11 between the first and second times t11, t12 and a voltage difference ΔV=V2−V1 between the second voltage level V2 and the first voltage level V1, the capacitance value $C_{GS}$ can be determined as follows:

$$C_{GS} = \frac{I3 \cdot \Delta t1}{\Delta V}. \tag{2}$$

The second change of the charge state in the example shown in FIG. 8 comprises discharging the internal capacitance 11 only via the internal resistance 12, which causes the control voltage $V_{GS}$ to fall exponentially towards the on level $V_{ON}$ starting from the second time t12. In the example shown in FIG. 8, the control voltage $V_{GS}$ from the second time t12 is given by:

$$V_{GS}(t) = V_{ON} + \left[(V2 - V_{ON}) \cdot e^{-\frac{(t-t12)}{\tau 1}}\right], \tag{3}$$

where τ1 is the time constant of an RC element formed by the internal capacitance 11 and the internal resistance 12, which is given by $$\tau 1 = C_{GS} \cdot R_{GS} \tag{4}$$

By means of the time constant τ1, the resistance value $R_G$s of the internal resistance can thus be determined by taking into account the previously determined capacitance value $C_{GS}$. For example, the time constant τ1 is determined by determining a time period required for the control voltage $V_{GS}$ to have fallen from a specified voltage level, such as the second voltage level V2, to another specified voltage level, such as the first voltage level V1. Assume t13 is a third time at which the control voltage $V_{GS}$ is returned to the first voltage level V1 and Δt2=t13−t12 is a period of time that elapses until the control voltage $V_{GS}$ has fallen from the second voltage level V2 to the first voltage level V1. Using equation (3) the control voltage $V_{GS}$(t13) at the third time t13 is then given by $$V_{GS}(t13) = V_{ON} + \left[(V2 - V_{ON}) \cdot e^{-\frac{(t13-t12)}{\tau 1}}\right] = V1. \tag{5a}$$

For the time constant τ1, based on equation (5a) the following then applies:

$$\tau 1 = \frac{\Delta t2}{\ln(V2 - V_{ON}) - \ln(V1 - V_{ON})}, \tag{5b}$$

where Δt2 denotes the time difference between the third time t13 and the second time t12. Taking into account the time constant τ1 thus obtained and taking into account the previously determined capacitance value $C_{GS}$, by using equation (4) the resistance value $R_G$s of the internal resistance 12 can be determined, or can at least be evaluated to determine whether this resistance value $R_G$s is above the desired minimum resistance value $R_{GS\_MIN}$.

For illustration purposes only, in the example shown in FIG. 8 it is assumed that the second change of the charge state comprises discharging the internal capacitance $C_G$s from the second voltage level V2 to the first voltage level V1 and that the time Δt2 required for this is determined. Of course, it is also possible during the discharge process of the control capacitance 11 to measure a period of time required to discharge the control capacitance 11 from any voltage level other than the second voltage level V2 to any voltage level other than the first voltage level V1.

Figure 9A:
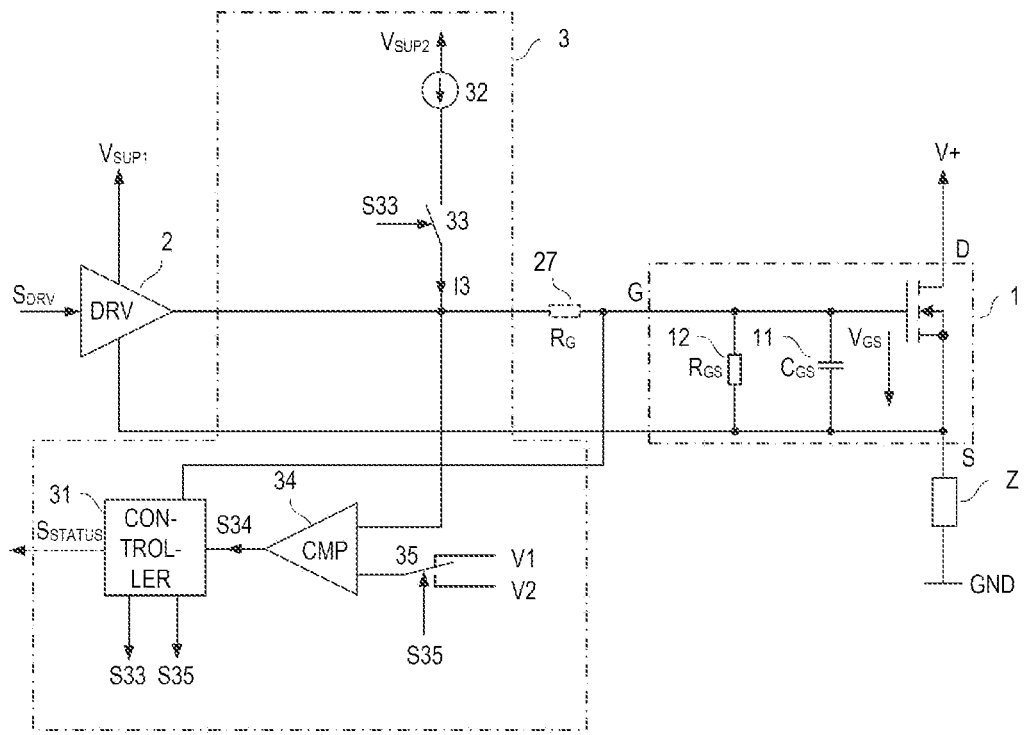
FIGS. 9A and 9B show an example of a circuit arrangement suitable for carrying out the method according to FIG. 8.

FIG. 9A shows an example of a test circuit 3, which is designed to carry out the method shown in FIG. 8. This test circuit 3 comprises a controller 31, which is designed to control the test procedure, a current source 32 which is designed to supply the constant charging current I3, and a switch 33 which is also referred to hereafter as the charging switch. A series circuit consisting of the current source 32 and the switch 33 is connected between an additional terminal for a supply potential and the first control terminal (the gate terminal) G. A second supply voltage $V_{SUP2}$ is applied between the additional terminal for the supply potential and the second control terminal (source terminal), which is higher than the first supply voltage $V_{SUP1}$ so that with the switch 33 closed, approximately the second supply voltage $V_{SUP2}$ is applied between the control terminals G, S. The switch 33 is opened or closed depending on a control signal S33, wherein the control signal S33 is generated by the controller 31.

Figure 9B:
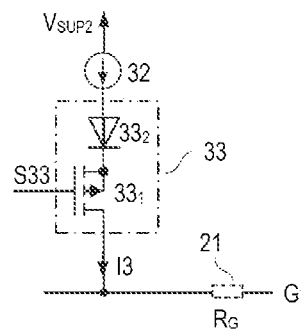

In the example shown in FIG. 9A, but also in the examples described below, the switch 33 can be implemented as any electronic switch, in particular as a bi-directionally blocking electronic switch. According to an example shown in FIG. 9B, the switch 33 comprises a MOSFET 331, such as a p-MOSFET, and a diode 332 which is connected in series with the MOSFET 331 and connected in anti-series with the body diode (not shown) of the MOSFET 331. The MOSFET 331 and the diode 332 are interconnected in such a way that the control capacitance can be charged when the MOSFET 331 is driven in a conducting mode, but that the activation capacitance 11 is prevented from discharging via the MOSFET 331.

Referring to FIG. 9A, the test circuit 3 also comprises a comparator 34, which receives the control voltage $V_{GS}$ at a first input and receives either the first voltage level V1 or the second voltage level V2 at a second input. Which of the two voltage levels V1, V2 is fed to the comparator 34 is also controlled by the controller 31, which is illustrated in FIG. 9 by the fact that a changeover switch 35 controlled by the controller 31 is connected upstream of the second input of the comparator 34. This changeover switch is controlled by the controller 31 using a control signal S35, as a result of which, controlled by the controller 31, either the first voltage level V1 or the second voltage level V2 is fed to the second input of the comparator 34.

The controller 31 is designed to close the first switch 33 at the beginning of the testing process to test the internal capacitance 11 and the internal resistance 12 so that the internal capacitance 11 is charged by the constant charging current I3 supplied by the power source 32, and to control the changeover switch 35 so that the comparator 34 receives the voltage level V1 at its second input first. When the control voltage $V_{GS}$ reaches the first voltage level V1, an output signal S34 of the comparator, which is fed to the controller 31, changes. The controller 31 then switches over the changeover switch 35 such that the second input of the comparator 34 receives the second voltage level V2. In addition, the controller 31 opens the switch 33 to stop the charging process when the comparator output signal S34 indicates that the control voltage $V_{GS}$ has risen to the second voltage level V2. In addition, the controller 31 receives the control voltage $V_{GS}$ or a signal representing the control voltage and is designed to determine the capacitance value $C_{GS}$ of the internal capacitance 11 in the manner explained above. The first and second times t11, t12 are signaled in the controller 31 by the comparator output signal S34, wherein the first time t11 occurs when control voltage $V_{GS}$ reaches the first voltage level V1, and the second time t12 occurs when the control voltage $V_{GS}$ reaches the second voltage level V2.

When the control voltage $V_{GS}$ reaches the second voltage level V2, the controller 31 switches off the switch 33 so that the internal capacitance 11 is no longer charged and is discharged via the internal resistance 12. In addition, the controller 31 switches over the changeover switch S35 so that the first voltage level V1 is applied again at the second input of the comparator 34. The third time t13 is signaled to the controller 31 by the comparator output signal S34, this time occurring when the control voltage $V_{GS}$ drops below the first voltage level V1.

Based on the control voltage $V_{GS}$, a time difference between the second time t12 and the third time t13, and based on the previously determined capacitance value $C_{GS}$, the controller 31 is then able to evaluate the resistance value $R_{GS}$ of the internal resistance 12.

The controller 31 can be designed to output a status signal $S_{STATUS}$ after each test operation, indicating whether the test has been passed without errors or whether an error has occurred, an error being assumed to be present if the capacitance value $C_{GS}$ or the resistance value $R_{GS}$ are outside of a respective desired range (see (1a) and (1b)). If a fault is detected, a higher-level controller (not shown) can initiate appropriate measures, such as disconnecting the supply voltage across the series circuit of the transistor component 1 and the load Z in a suitable manner.

Figure 10:
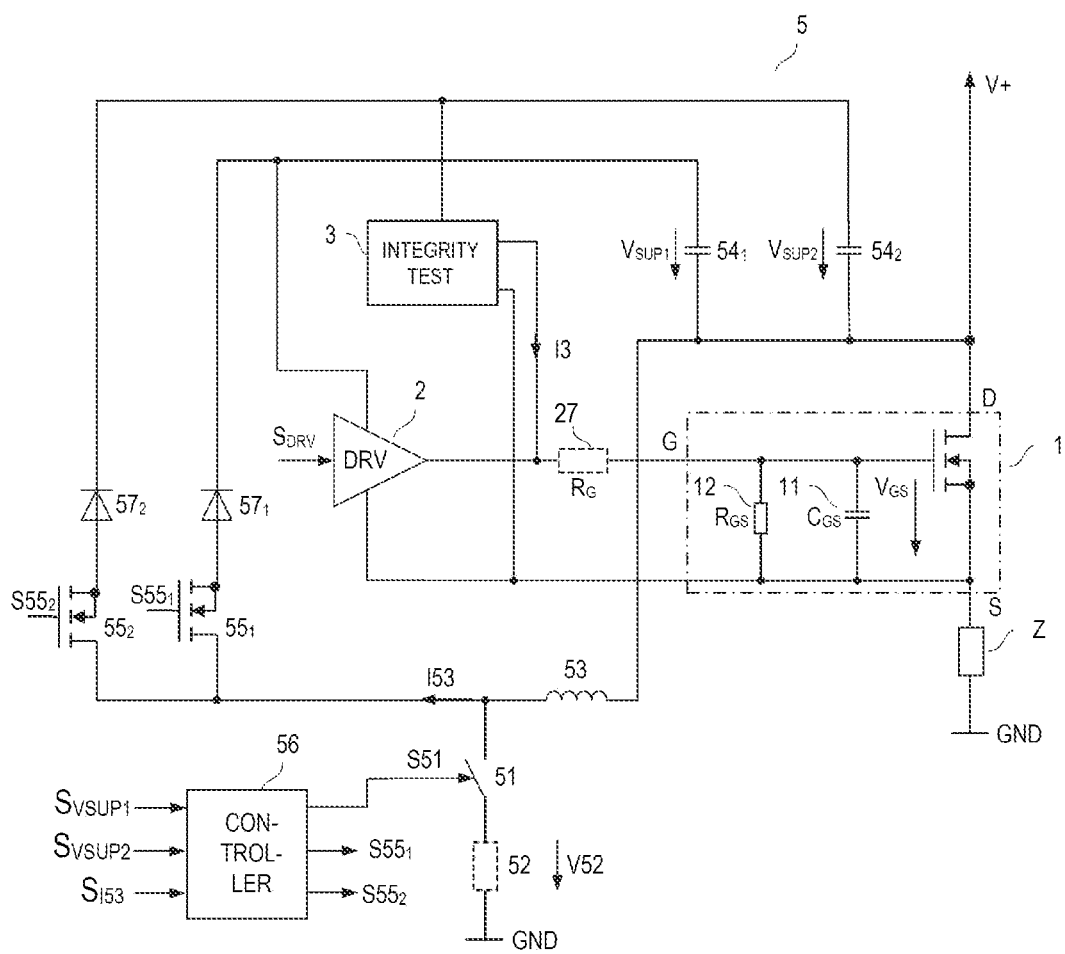
FIG. 10 shows an example of a voltage supply circuit designed to provide two different supply voltages.

FIG. 10 shows an example of a supply circuit 5, which is designed to generate the first supply voltage $V_{SUP}$ of the driver circuit 2 and the second supply voltage $V_{SUP2}$ of the test circuit 3 based on the load supply voltage V+. In this example, these two supply voltages $V_{SUP}$, $V_{SUP2}$ are higher than the load supply voltage V+, wherein the first supply voltage $V_{SUP1}$ is available at a first supply capacitor $54_1$ and the second supply voltage $V_{SUP2}$ is available at a second supply capacitor $54_2$. A step-up converter with an inductance 53 and a first switch 51 receives the load supply voltage V+ and provides a charging current I53 for the two capacitors $54_1$, $54_2$. The charging current I53 provided by the step-up converter flows via respective switches $55_1$, $55_2$ to the supply capacitors $54_1$, $54_2$. A controller 56 controls the switch 51 of the step-up converter and the switches $55_1$, $55_2$, one of which is connected between the step-up converter and the first supply capacitor $54_1$ and the other between the step-up converter and the second supply capacitor $54_2$. The switch $55_1$ connected between the step-up converter and the first supply capacitor $54_1$ is also referred to hereafter as the first charging switch and the switch 552 connected between the step-up converter and the second supply capacitor $54_2$ is also referred to hereafter as the second charging switch.

The controller 56 receives a first supply signal $S_{VSUP1}$, for example, which represents the first supply voltage $V_{SUP1}$, a second supply signal $S_{VSUP2}$ which represents the second supply voltage $V_{SUP2}$, and a current signal $S_{I53}$ which represents the charge current provided by the step-up converter. The current measurement signal $S_{I53}$ can be obtained, for example, by measuring a voltage V52 across a resistor 52 (shown by dotted lines in FIG. 10) connected in series to the switch 51 of the step-up converter. The supply signals $S_{VSUP1}$, $S_{VSUP2}$ can be obtained using conventional voltage sensors by means of the supply voltages $V_{SUP1}$, $V_{SUP2}$.

Whenever the switch 51 of the step-up converter is switched on by the controller 56 via a corresponding control signal S51, energy is stored in the inductance 53 of the step-up converter. With the switch 51 switched off, this energy is discharged via at least one of the first and second charging switches $55_1$, $55_2$ and the respective storage capacitor $54_1$, $54_2$. According to an example, the controller 56 is designed to switch on at least one of the two charging switches $55_1$, $55_2$ via corresponding control signals $S55_1$, $S55_2$ before the switch 51 of the step-up converter is switched off, so that a discharge current path is available for the inductance 53 in any event.

For example, the controller is designed to activate the step-up converter whenever at least one of the two supply voltages $V_{SUP1}$, $V_{SUP2}$ is below a respective setpoint. "Activating the step-up converter" means switching the switch 51 on and off repeatedly. With the step-up converter activated, the charging switch $55_1$, $55_2$ that is connected to the supply capacitor $54_1$, $54_2$ with the supply voltage $V_{SUP1}$, $V_{SUP2}$ below the respective setpoint, can be switched on and off permanently or switched on and off periodically, until the supply voltage has risen to the respective setpoint. Of course, when charging the supply capacitors $54_1$, $54_2$ a hysteresis can be provided, so that the step-up converter is activated whenever at least one of the two supply voltages $V_{SUP1}$, $V_{SUP2}$ has fallen to a respective lower threshold value and is then deactivated again when one or both of the supply voltages $V_{SUP1}$, $V_{SUP2}$ has risen to a respective upper threshold.

According to an example, the two charging switches $55_1$, $55_2$ are each implemented as MOSFETs, for example as n-MOSFETs, and are interconnected in such a way that they prevent charging of the respective supply capacitor $54_1$, $54_2$ in the switched-off state (i.e. in the blocking state). If the two charging switches $55_1$, $55_2$ are implemented as MOSFETs, according to an example a diode $57_1$, $57_2$ is connected in series with each of the two charging switches $55_1$, $55_2$. Each of the two diodes $57_1$, $57_2$ is connected anti-serially to the body diode (not shown) of the respective connected MOS- FET $55_1$, $55_2$, so that when the MOSFET $55_1$, $55_2$ is activated in a conducting mode, the respective supply capacitor $54_1$, $54_2$ is prevented from discharging via the MOSFET in any event.

Figure 11:
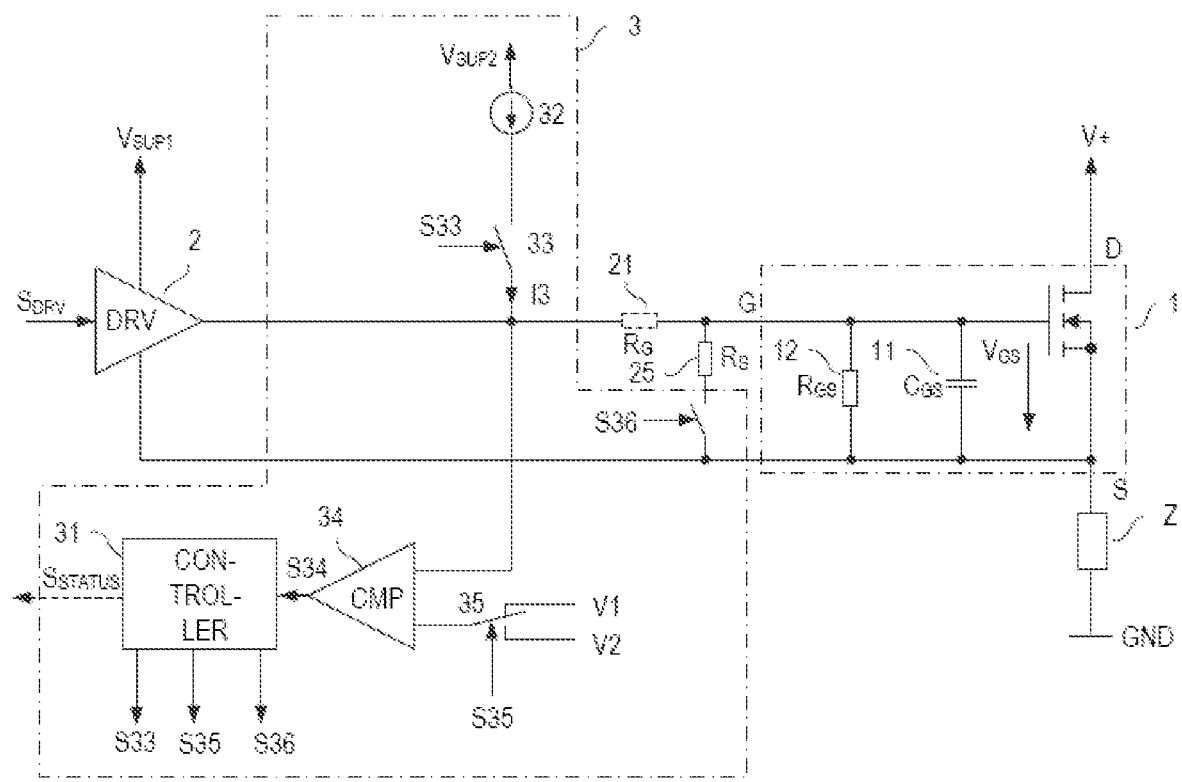
FIG. 11 shows an example of a circuit comprising a transistor component and an external discharge resistor.

According to an example shown in FIG. 11, an external resistor 25 can be connected between the control terminals G, S of the transistor component 1, wherein this resistor 25 is designed to ensure that the two control terminals G, S are approximately at the same electrical potential when the driver circuit 2 is deactivated, in other words that the first control terminal G is not floating. A resistance value $R_S$ of this external resistor 25 is very much lower than the resistance value $R_{GS}$ of the internal resistance 12, if the latter is intact. In order to prevent the external resistor 25 from affecting the testing of the internal capacitance 11 and the internal resistance 12, according to an example a further switch 36 is provided, which is connected in series with the external resistor 25 and is controlled by the controller 31 of the test circuit 3. In this example, the controller 31 is designed to open the switch S36 during the testing process, i.e. during the first change and the second change of the charge state of the internal capacitance 11, so that during the first change of the charge state, the charge current 3 essentially only flows into the internal capacitance 11 and during the second change of the charge state, the internal capacitance 11 is essentially discharged only via the internal resistance 12.

Figure 12:
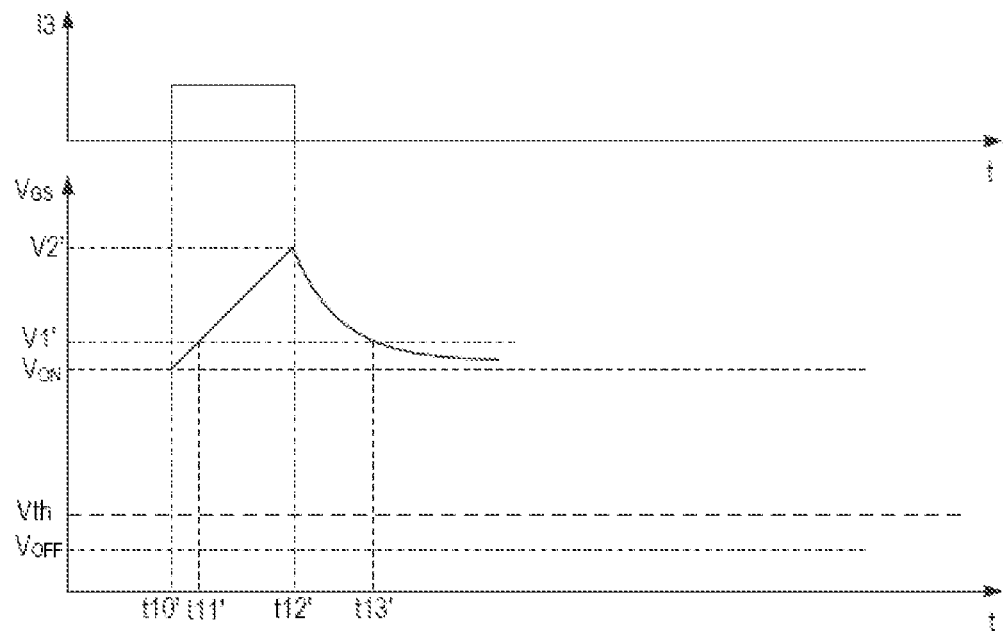
FIG. 12 shows signal waveforms illustrating a method for testing the external discharge resistor.

According to an example, it is provided that testing the integrity of the transistor component 1 also comprises testing this external resistor 25. The external resistor 25 can be tested in the same way as the internal resistance 12 is tested. An example of this is illustrated in FIG. 12. To test the external resistor 25, for example, the internal capacitance 11 is charged by the charging current I3 until the control voltage $V_{GS}$ has reached a specified value V2'. During this charging process, for example, the switch 36 is open, so that the charging current I3 essentially only flows into the internal capacitance 11.

Once the control voltage $V_{GS}$ has reached the specified voltage level V2', the charging process is terminated and the switch 36 is closed so that the internal capacitance 11 is discharged via the parallel circuit of the internal resistance 12 and the external resistor 25. This change of the charge state of the internal capacitance 11 by discharging through the internal resistance 12 and the external resistor 25 is also referred to hereafter as the third change of the charge state. Since the resistance value of the external resistor 25 is significantly lower than that of the internal resistance 12, the discharge process is essentially determined by the resistance value $R_S$ of the external resistor 25. According to the example described in FIG. 8, a period of time required by the control voltage $V_{GS}$ to fall from the specified voltage level V2' to another specified voltage level V1' is determined, wherein by taking into account this time period and the specified voltage levels V1', V2' and taking into account the capacitance value $C_{GS}$, the resistance value of the external resistor 25 can be determined. The capacitance value $C_{GS}$ can be determined during the charging process of the internal capacitance 11 as shown in FIG. 12, in the same way as explained previously using FIG. 8. In addition, it is also possible to carry out the test procedure explained using FIG. 8 and to use the capacitance value $C_{GS}$ thereby obtained for testing the external resistor 25 also.

Figure 13:
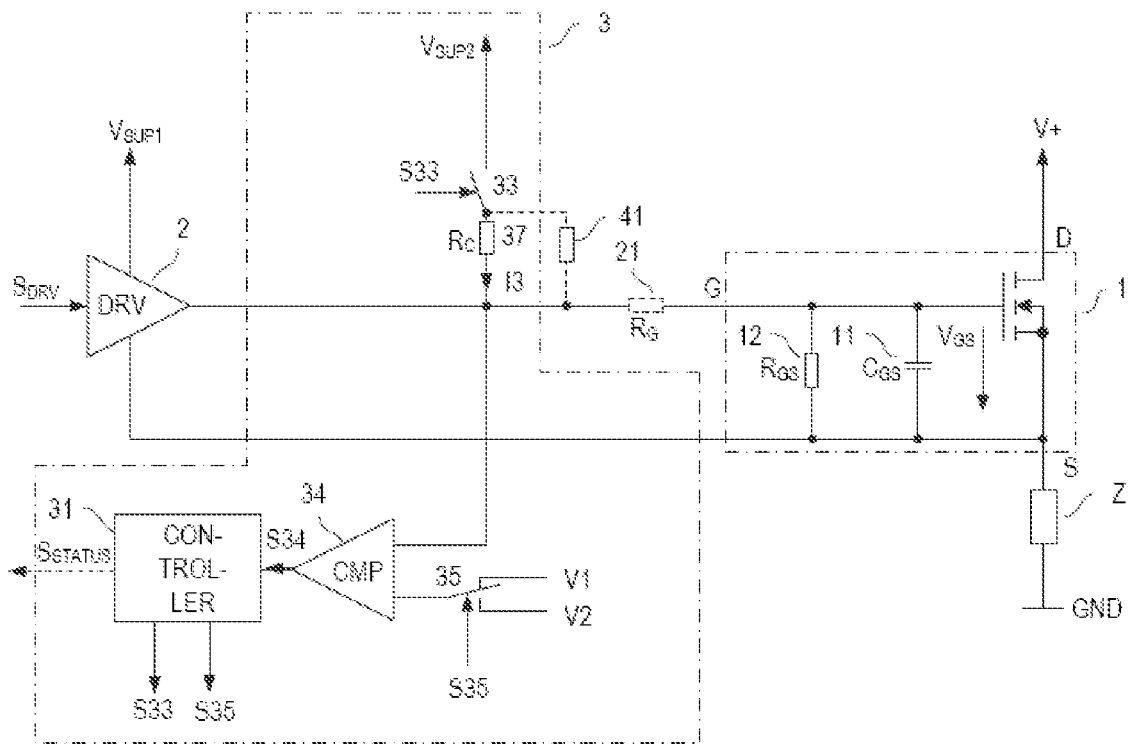
FIG. 13 shows a variant of the circuit according to FIG. 9.

FIG. 13 shows a modification of the test circuit 3 shown in FIG. 11. In the example shown in FIG. 13, instead of the current source a resistor 37 is present, via which, with the switch 33 closed, the internal capacitance 11 is charged. Referring to FIGS. 7, 9, 10, 11 and 13, a resistor 27 (which is usually referred to as a gate series resistor) can be connected between an output of the driver circuit 2 and the first control terminal G. This resistor 27 influences the level of a current flowing to the internal capacitance 11 or a current flowing from the internal capacitance 11 when the transistor component 1 is activated in a conducting or blocking mode by the driver circuit 2. The test circuit 3 can be connected to the control input in such a way that the series resistor 27 is located between the output of the driver circuit 2 and the node at which the test circuit 3 feeds in the charging current I3. In this case, the series resistor 27 does not affect the charging process of the internal capacitance 11. As shown in FIG. 13, it is also possible to connect the series resistor 27 between the first control terminal G and the node at which the test circuit 3 feeds in the charging current I3. In this case, the series resistor 27 influences the charging process of the internal capacitance 11 and the resistor 37 in the test circuit 3 could also be omitted.

The test circuit 3 can be implemented as an integrated circuit. In this case, an external resistor 41 can additionally be provided in parallel with the resistor 37. This external resistor 41 can be used to define the charging current I3 which flows when the switch 33 is closed.

Figure 14:
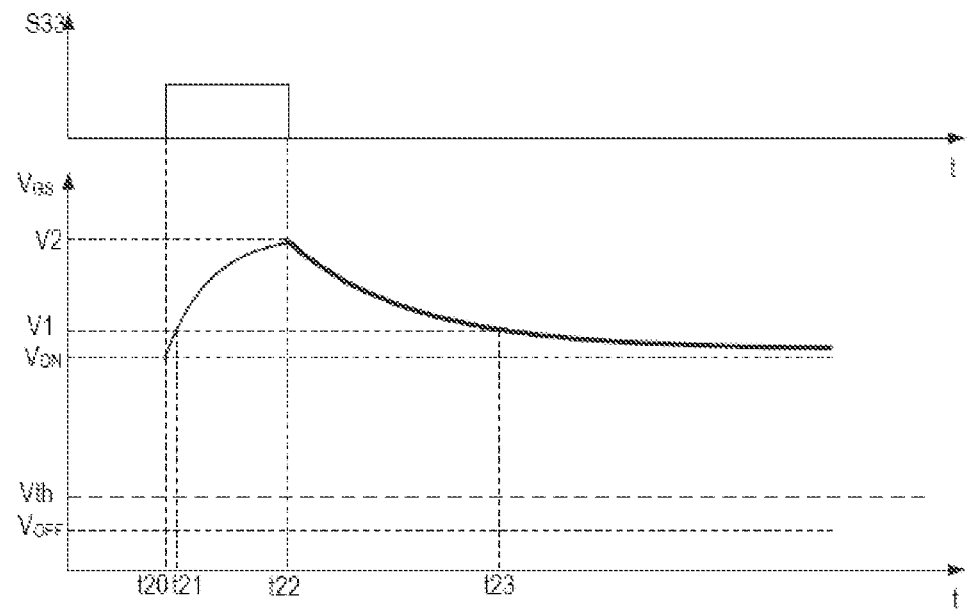
FIG. 14 shows temporal waveforms illustrating a method for testing the functional integrity of the transistor component using the circuit shown in FIG. 13.

An example of a testing method that can be carried out by means of the circuit shown in FIG. 13 is illustrated in FIG. 14, wherein FIG. 14 shows the temporal waveforms of a control signal S33 of the switch 33 and the control voltage $V_{GS}$. In this method, the test procedure begins at a start time t20, when the switch 33 is closed so that the control voltage $V_{GS}$ increases. In this example, the control voltage $V_{GS}$ increases exponentially according to $$V_{GS}(t) = V_{ON} + \left[(V_{SUP2} - V_{ON}) \cdot \left(1 - e^{-\frac{(t-t20)}{\tau 2}}\right)\right] \quad (6)$$

where a time constant τ2 of this exponential increase is given by $$\tau 2 = R \cdot C_{GS} \quad (7),$$

where R denotes the resistance value of a resistor or resistor network connected between the switch 33 and the first control terminal G. This resistor network can comprise the series resistor 27, the resistor 37 of the test circuit 3 and the external resistor 41, or any combination of these resistors.

As in the method according to FIG. 8, the method according to FIG. 14 provides, for example, for measuring a period of time that elapses between a first time t21 and a second time t22, wherein the first time t21 is the time at which the control voltage $V_{GS}$ reaches the first voltage level V1 and the second time t22 is the time at which the control voltage $V_{GS}$ reaches the second voltage level V2. Knowing the voltage levels V1, V2 and the time difference t22−t21 between the first and second times, the internal capacitance value $C_{GS}$ can be determined from the exponential charging characteristic if the resistance value R of the resistor network is known. In this method the second change of the charge state of the internal capacitance 11 can be carried out in the same way as that described using FIG. 8, in order thus to evaluate the resistance value $R_{GS}$ of the internal resistance 12.

As in the example shown in FIG. 11, the circuit shown in FIG. 13 may also have an external resistor between the control terminals G, S, but this resistance is not shown in FIG. 13.

Figure 15:
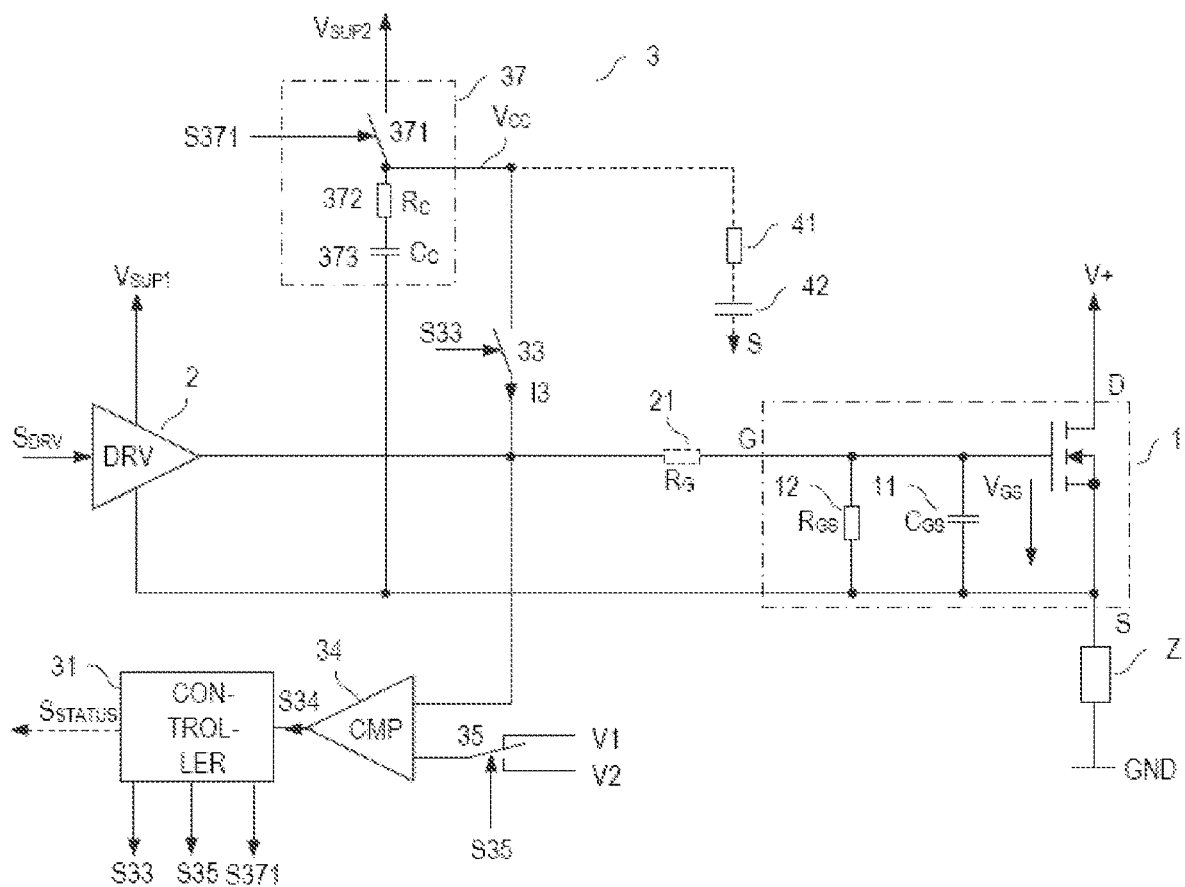
FIG. 15 shows a variant of the circuit according to FIG. 13.

FIG. 15 shows a modification of the circuit shown in FIG. 13. In the circuit shown in FIG. 15, the test circuit 3 comprises a capacitive storage circuit 81 with a storage capacitor 373, a resistor 372 and a charging switch 371, wherein a series circuit of the charging switch 371, the resistor 372 and the storage element 373 is connected between the additional terminal for the supply potential and the second control terminal (source terminal S), so that the second supply voltage $V_{SUP2}$ is applied across the series circuit. The charging switch 33 of the internal capacitance 11 is connected to a node between the charging switch 317 of the capacitive storage circuit 81 and the resistor 372.

The charging switch 371 of the capacitive storage circuit 81 is activated by the controller 31. In this test circuit, the storage capacitor 373 is charged up to the second supply voltage $V_{SUP2}$ by closing the charging switch 371 before the test procedure. Then the charging switch 371 of the capacitive storage circuit 81 is opened and the charging switch 33 for the internal capacitance 11 is closed, so that the internal capacitance 11 is connected in parallel with a series circuit of the storage capacitor 373 and the resistor 372, thereby charging the internal capacitance 11.

Figure 16:
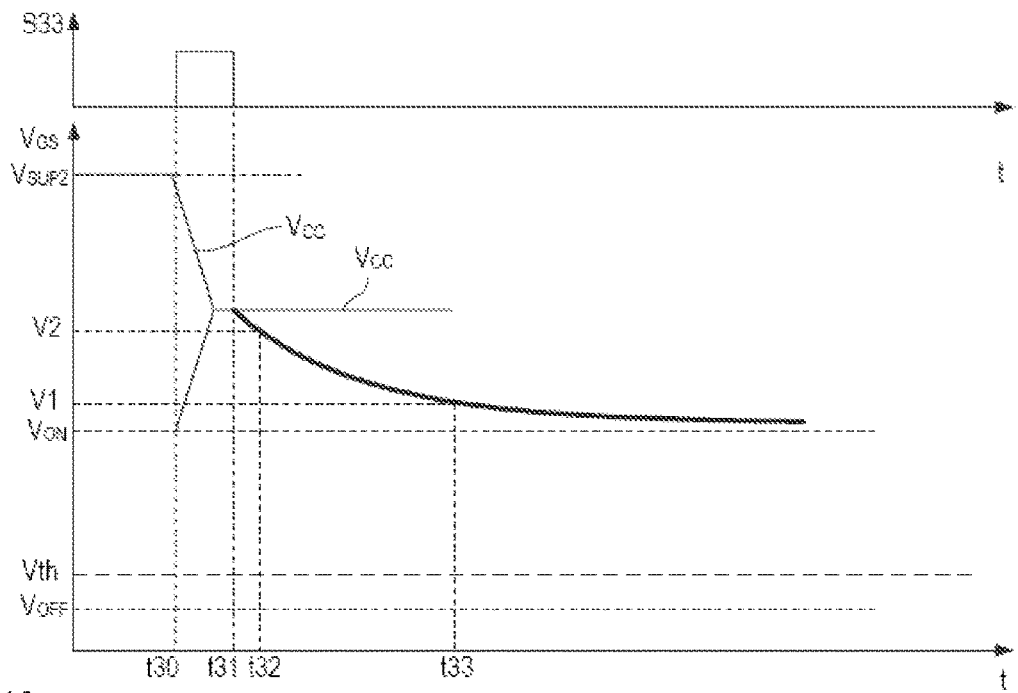
FIG. 16 shows temporal waveforms illustrating a method for testing the functional integrity of the transistor component using the circuit shown in FIG. 15.

FIG. 16, which shows timing diagrams of the control signal S33 of the switch 33 and the control voltage $V_{GS}$, illustrates this charging process, which begins at a time t30. In FIG. 15 and FIG. 16, $V_{CC}$ refers to a voltage across the series circuit with the storage capacitor 373 and the resistor 372. When the charging switch 33 between the storage capacitor 373 and the internal capacitance 11 is closed, the control voltage $V_{GS}$ increases by the same amount as the voltage $V_{CC}$ across the storage capacitor $C_C$ decreases. The decrease in the voltage $V_{CC}$ across the capacitor $C_C$ and the increase in the control voltage $V_{GS}$ both occur exponentially, but this is not shown in FIG. 16.

The first change of the charge state of the internal capacitance 11 in the example shown in FIG. 16 comprises charging the internal capacitance 11, wherein to determine the capacitance value $C_{GS}$, for example, a period of time that elapses until the control voltage $V_{GS}$ has risen from a first voltage level V1 to a second voltage level V2 is determined. With knowledge of these voltage levels V1, V2, the determined period of time and with knowledge of the capacitance value of the storage capacitor $C_C$, the capacitance value $C_{GS}$ of the internal capacitance 11 can be determined.

For example, in the example shown in FIG. 15, the storage capacitor 373 is selected in such a way that its capacitance value $C_C$ has the same order of magnitude as the capacitance value $C_{GS}$ of the internal capacitance 11 if the internal capacitance 11 is intact. For example, the capacitance value $C_C$ of the storage capacitor 373 is between 0.5 and 10 times the capacitance value $C_{GS}$ of the intact internal capacitance 11.

Figure 17:
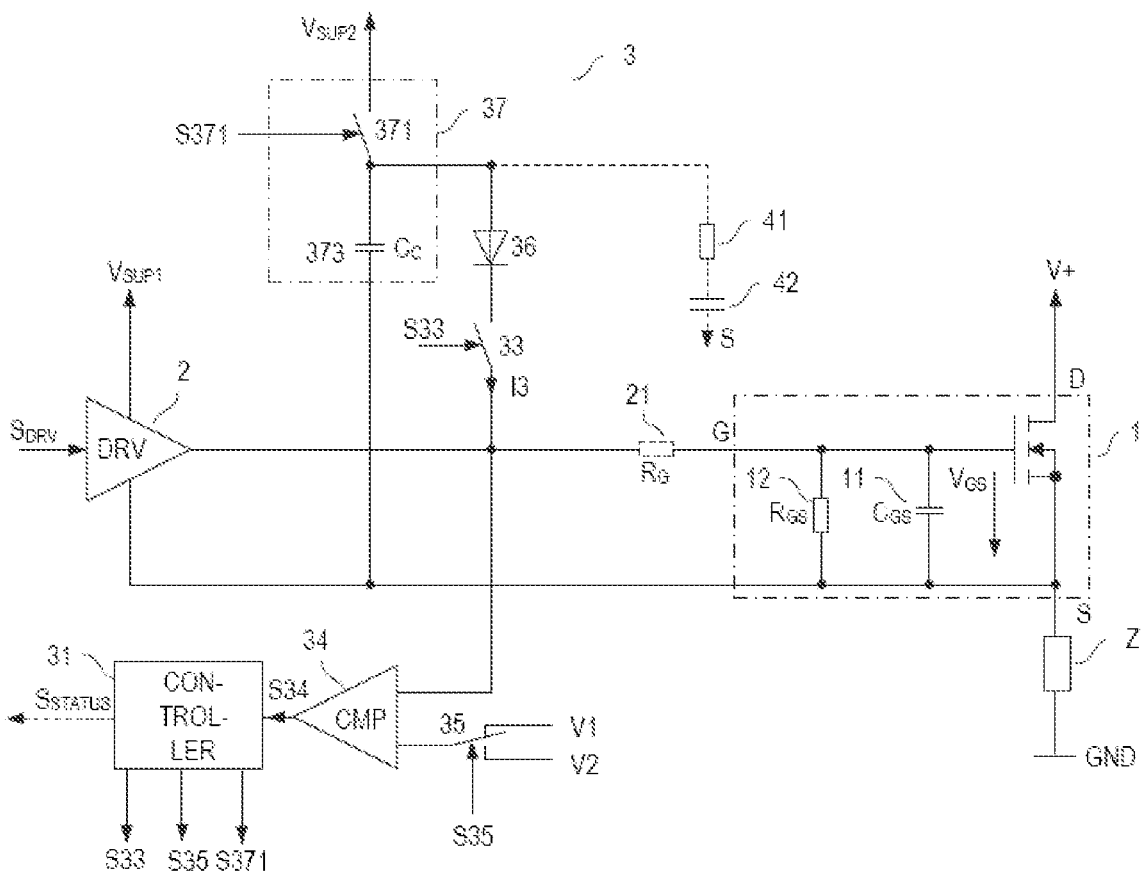
FIG. 17 shows a variant of the circuit according to FIG. 15.
Figure 18:
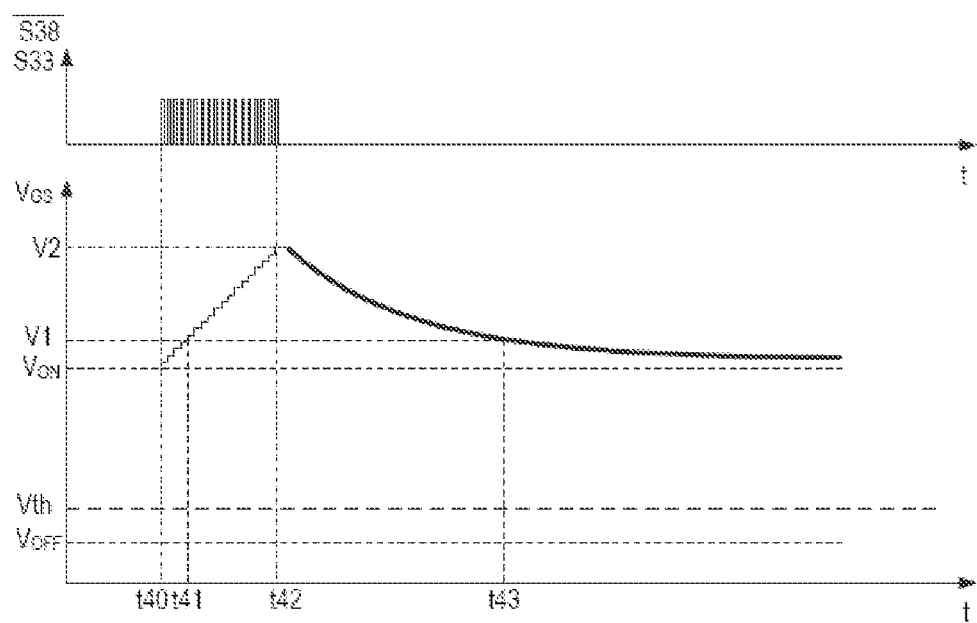
FIG. 18 shows temporal waveforms illustrating a method for testing the functional integrity of the transistor component using the circuit shown in FIG. 17.

FIG. 17 shows a variation of the test circuit shown in FIG. 15. In the test circuit 3 shown in FIG. 17, the resistor 372 is omitted and the storage capacitor 373 is chosen in such a way that its capacitance value $C_C$ is significantly lower than the capacitance value $C_{GS}$ of the intact internal capacitance 11. A method for testing the integrity of the transistor component 1 using this test circuit 3 is shown in FIG. 18, wherein FIG. 18 shows temporal waveforms of control signals of the charging switch 33 connected between the capacitive storage circuit 81 and the first control terminal G, a control signal S371 of the charging switch 371 of the capacitive storage circuit 81, and the control voltage $V_{GS}$. In this method, the controller 31 controls the two charging switches 371, 33 in a complementary manner, wherein each time the charging switch 371 is closed the storage capacitor 373 is charged and each time the switch 33 is opened, the storage capacitor 373 is discharged towards the internal capacitance 11. It can be assumed to a good approximation that each time the switch 33 is closed, an approximately equal charge quantity is transferred to the internal capacitance 11, which causes the actuation voltage $V_{GS}$ to increase. To test the capacitance value $C_{GS}$, it is now possible, for example, to determine the time required to increase the control voltage $V_{GS}$ from a first voltage level V1 to a second voltage level V2. Alternatively, the number of charging cycles required to increase the control voltage $V_{GS}$ from the first voltage value V1 to the second voltage value V2 can be counted. On the basis of the number of these charge cycles or the measured time period, and knowing the frequency with which the two charging switches 371, 33 are activated and knowing the two voltage levels V1, V2, it is possible to determine the capacitance value $C_{GS}$.

The second change of the charge state of the internal capacitance 11 can be carried out in the same way as in the methods described above, so that the resistance value $R_{GS}$ of the internal resistance 12 can be determined or evaluated in the same way as explained above if the capacitance value $C_{GS}$ is known.

Figure 19:
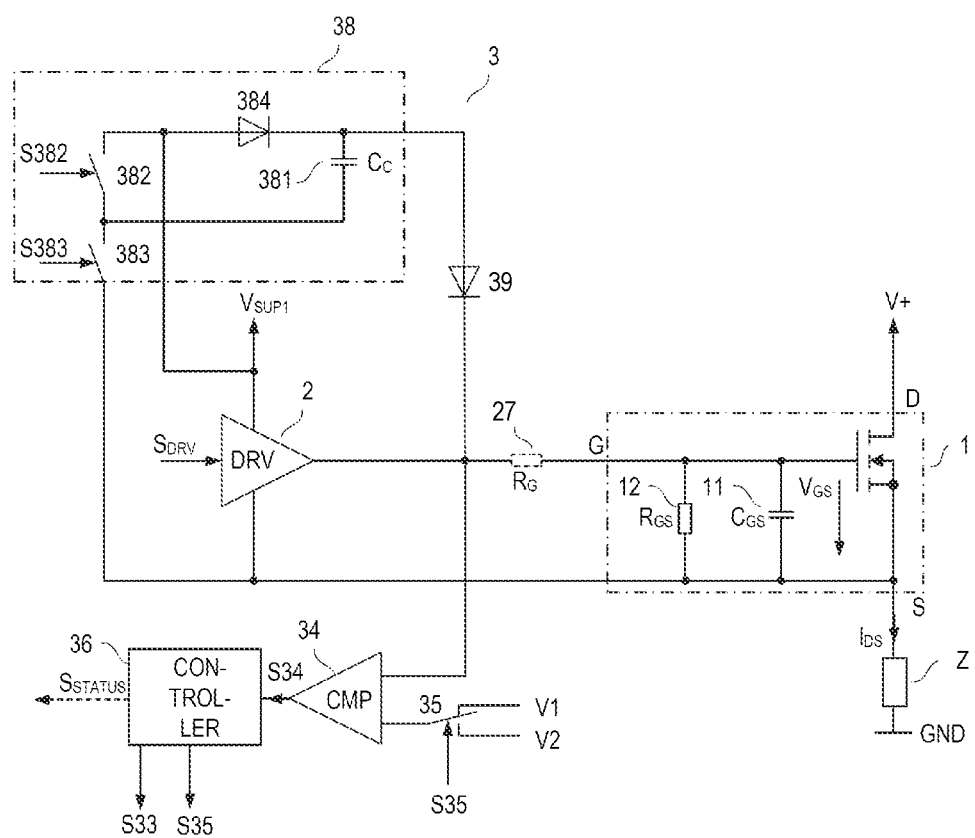
FIG. 19 shows a variant of the circuit according to FIG. 17.

FIG. 19 shows a variation of the circuit shown in FIG. 17. In the circuit according to FIG. 19, a charge pump 38 is present which charges a storage capacitor 381 based on the first supply voltage $V_{SUP1}$ and then discharges it in the direction of the internal capacitance 11 in pulsed mode. The charging capacitor 381 here is connected to the first control terminal G via a rectifier element 39, such as a diode. In addition, one terminal of the capacitor 381 directed away from the rectifier element 39 is connected to the terminal for the first supply potential $V_{SUP1}$ via a first switch 382 and connected to the second control terminal S via a second switch 383. A further rectifier element 384 is also connected between the terminal directed towards the rectifier element 39 and the terminal for the first supply voltage $V_{SUP1}$.

The two switches 382, 383 are activated by the controller 31 in a complementary manner, wherein each time the second switch 383 is closed, the charging capacitor 381 is charged up to the first supply voltage $V_{SUP1}$. When the second switch 383 is opened and the first switch 382 is closed, the charging capacitor 381 is discharged in the direction of the internal capacitance 11. The first change of the charge state of the internal capacitance 11 is carried out in the same way as explained based on FIG. 18, so that the capacitance value $C_{GS}$ can be determined in the same way as explained based on FIG. 18.

As explained above, in order to test the integrity of the transistor component 1, in addition to the internal capacitance 11 and the internal resistance 12, the presence or the resistance value of an external resistor 25 can be tested. This external resistor 25 can be tested in a separate test cycle, as explained based on FIG. 12. However, this external resistor 25 can also be tested in the same test cycle in which the internal resistance 12 is tested. An example of this is shown in FIG. 20.

Figure 20:
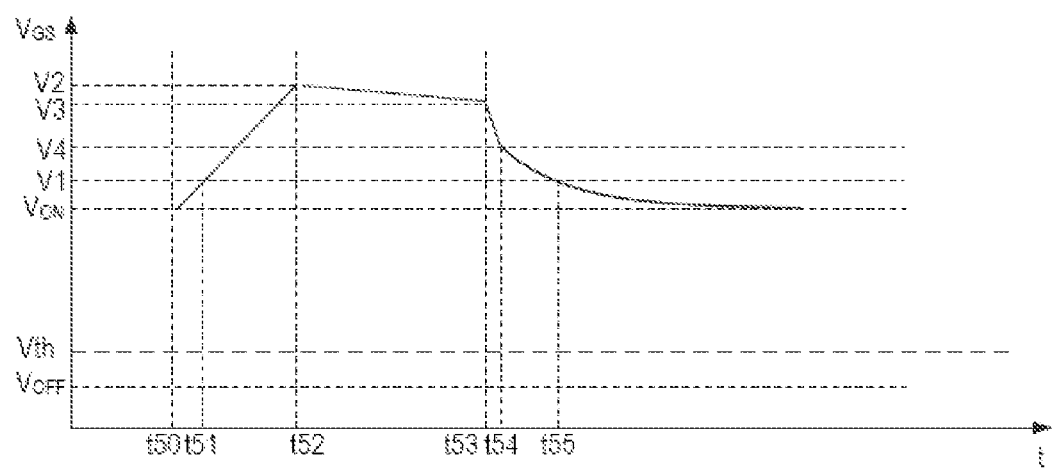
FIG. 20 shows signal waveforms illustrating another method for testing the functional integrity of the transistor component.

In the example according to FIG. 20, after charging the internal capacitance 11 to the second voltage level V2, the method provides for carrying out a second change of the charge state of the internal capacitance 11, by first discharging the internal capacitance 11 via the internal resistance 12 only. This is shown in FIG. 20 between a second time t52 at which the control voltage $V_{GS}$ reaches the second voltage level V2, and a third time t53, wherein the third time t53 represents a time at which the control voltage $V_{GS}$ has fallen to a third voltage level V3. Based on the second and third voltage levels V2, V3 and based on a time difference between the third time t53 and the second time t52, and with knowledge of the previously determined capacitance value $C_{GS}$, the resistance value $R_{GS}$ of the internal resistance 12 can be evaluated.

In the method illustrated in FIG. 20, it is also provided to connect in the external resistor 25 at a time t54 and to determine a time difference that elapses until the control voltage $V_{GS}$ has fallen to another voltage level, such as the first voltage level V1. Knowing the time difference between the times t55, t54 and knowing a difference between the voltage values that the control voltage $V_{GS}$ has at these times t54, t55, the external resistor 25 can be evaluated. In the example shown in FIG. 20, the external resistor 25 is evaluated after the evaluation of the internal resistance 12. But this is merely one example. It is also possible to first connect in the external resistor 25 to evaluate the external resistor 25 and then deactivate the external resistor again to evaluate the internal resistance 12.

In addition, in the example shown in FIG. 20 the LS switch 22 of the driver circuit 2 can be evaluated. For this purpose, for example, this LS switch 22 is switched on for a certain period of time, which in the example shown in FIG. 20 is between the times t53 and t54, and it is checked whether the internal capacitance 11 is discharged during this period to a point where the control voltage $V_{GS}$ decreases by at least a specified value during this time period. The resulting change in the charge state of the internal capacitance 11 is referred to hereafter as the fourth change in the charge state. The period during which the LS switch 22 is closed is chosen in such a way that the control voltage $V_{GS}$ does not drop below the on level $V_{ON}$. Alternatively, the voltage by which the control voltage $V_{GS}$ should decrease when the LS switch 22 is closed can also be specified, and the time required for this can be measured. If the control voltage $V_{GS}$ does not drop by a specified value within a specified switch-on period of the LS switch 22 or if the control voltage $V_{GS}$ takes longer than a specified period of time to drop by a specified value, this indicates a defect in the LS switch 22.

In the example shown in FIG. 20, after charging the internal capacitance, the internal resistance 12 is tested first, then the LS switch 22 is tested, and then the external resistor 25 is tested. The first change of the charge state of the internal capacitance is followed by the second change of the charge state, then the fourth change of the charge state and then the third change of the charge state. But this is merely one example. These changes of the charge state and the associated tests of the internal resistance 12, the external resistance 25 and the low-side switch 22 can be performed in any order.

What is claimed is:

1. A method for testing a functional integrity of a transistor component, the method comprising:
    causing a first change of a charge state of an internal capacitance between control terminals of the transistor component;
    determining a capacitance value of the internal capacitance based on the first change of the charge state;
    causing a second change of the charge state of the internal capacitance; and
    evaluating a resistance value of an internal resistance between the control terminals based on the determined capacitance value and the second change of the charge state.

2. The method as claimed in claim 1, wherein:
    the transistor component has a threshold voltage and
    the first change of the charge state of the internal capacitance takes results in an increase of a difference between a control voltage applied between the control terminals and the threshold voltage.

3. The method as claimed in claim 2, wherein the first and second change of the charge state of the internal capacitance take place when the control voltage reaches a turn-on level.

4. The method as claimed in claim 1, wherein determining the capacitance value comprises measuring a period of time during the first change of the charge state, during which time period a control voltage applied between the control terminals changes from a first defined voltage level to a second defined voltage level.

5. The method as claimed in claim 4, wherein the causing the first change of the charge state comprises charging the internal capacitance with an essentially constant charging current.

6. The method as claimed in claim 4, wherein causing the first change of the charge state comprises applying an essentially constant voltage to a series circuit comprising the internal capacitance and a charging resistor.

7. The method as claimed in claim 1, wherein
    causing the first change of the charge state comprises charging the internal capacitance gradually via charge pulses; and
    determining the capacitance value comprises performing one of the following steps during the first change of the charge state:
        determining a period of time during which a control voltage applied between the control terminals changes from a first defined voltage level to a second defined voltage level, or
        determining a number of charge pulses which cause the control voltage applied between the control terminals to change from the first defined voltage level to the second defined voltage level.

8. The method as claimed in claim 1, wherein causing the second change of the charge state of the internal capacitance comprises discharging the internal capacitance only via the internal resistance between the control terminals.

9. The method as claimed in claim 8, wherein evaluating the resistance value of the internal resistance between the control terminals comprises measuring a period of time during which a control voltage applied between the control terminals changes from a first defined voltage level to a fourth defined voltage level.

10. The method as claimed in claim 1, further comprising:
    causing a third change of the charge state of the internal capacitance before or after the second change of the charge state; and
    evaluating the resistance value of an external resistor connected between the control terminals, based on the third change of the charge state, wherein causing the third change of the charge state comprises discharging the internal capacitance via the internal resistance and the external resistor.

11. The method as claimed in claim 1, further comprising:
    causing a fourth change of the charge state of the internal capacitance before or after the second change of the charge state; and
    evaluating the functional integrity of a driver circuit connected to the control terminals, wherein causing the fourth change of the charge state comprises discharging the internal capacitance via an electronic switch of the driver circuit.

12. An electronic circuit comprising:
a test circuit configured to be connected to control terminals of a transistor component, the test circuit configured to:
  cause a first change of a charge state of a first capacitance present between control terminals of the transistor component,
  determine a capacitance value of the first capacitance based on the first change of the charge state,
  cause a second change of the charge state of the first capacitance present between the control terminals of the transistor component, and
  determine a resistance value of a resistance present between the control terminals based on the determined capacitance value and the second change of the charge state.

13. The electronic circuit as claimed in claim 12, wherein the test circuit is configured to cause the first change of state of the first capacitance by increasing a difference between a control voltage between the control terminals and a threshold voltage of the transistor component.

14. The electronic circuit as claimed in claim 13, wherein the test circuit is configured to cause the first change of the charge state of the first capacitance and the second change of the charge state of the first capacitance when the control voltage reaches a turn-on level.

15. The electronic circuit as claimed claim 12, wherein the test circuit is configured to:
  during the first change of the charge state, determine a period of time from when a control voltage applied between the control terminals changes from a first defined voltage level to a second defined voltage level; and
  determine the capacitance value based on the determined period of time.

16. The electronic circuit as claimed in claim 15, wherein the test circuit is configured to cause the first change of the charge state by charging the first capacitance with an essentially constant charging current.

17. The electronic circuit as claimed in claim 15, wherein the test circuit is configured to cause the first change of the charge state by applying an essentially constant voltage to a series circuit comprising the first capacitance and a charging resistor.

18. The electronic circuit as claimed in claim 12, wherein the test circuit is configured to:
  cause the first change of the charge state by applying a plurality of charge pulses to the first capacitance;
  and determine the capacitance value by:
    determining a period of time during which a control voltage applied between the control terminals changes from a first defined voltage level to a second defined voltage level; or
    determining a number of charge pulses which cause the control voltage between the control terminals to change from the first defined voltage level to the second defined voltage level.

19. The electronic circuit as claimed in claim 18, wherein the test circuit is configured to cause the second change of the charge state of the first capacitance by discharging the first capacitance only via the resistance present between the control terminals.

20. A test circuit comprising:
a signal generator configured to be coupled between a control terminal and a reference terminal of a switching transistor;
a measurement circuit configured to be coupled between the control terminal of the reference terminal of the switching transistor;
a controller configured to:
  cause the signal generator to charge an internal capacitance of the switching transistor from a first voltage level to a second voltage level;
  determine a value of the internal capacitance based on a time that it takes to charge the internal capacitance the first voltage level to the second voltage level; and
  after causing the signal generator to charge the internal capacitance of the switching transistor, allow the internal capacitance of the switching transistor to discharge from a third voltage level to a fourth voltage level via a first resistance between the control terminal and the reference terminal; and
  determine a value of the first resistance based on the determined value of the internal capacitance and a time that it takes to discharge the internal capacitance from the third voltage level to the fourth voltage level.

21. The test circuit of claim 20, wherein the third voltage level is substantially equal to the second voltage level, and the fourth voltage level is substantially equal to the first voltage level.

22. The test circuit of claim 20, wherein:
the signal generator comprises a current source; and
the controller is configured to cause the signal generator to charge the internal capacitance of the switching transistor by activating the current source.

23. The test circuit of claim 22, wherein:
the signal generator comprises a switch; and
the controller is configured to cause the signal generator to charge the internal capacitance of the switching transistor by applying a reference voltage to the switching transistor via the switch.

* * * * *